United States Patent [19]

Esquivel et al.

[11] Patent Number: 4,977,439

[45] Date of Patent: Dec. 11, 1990

[54] BURIED MULTILEVEL INTERCONNECT SYSTEM

[76] Inventors: Agerico L. Esquivel, 13912 Waterfall Way, Dallas, Tex. 75240; Allan T. Mitchell, 2913 Green Meadow, Garland, Tex. 75042

[21] Appl. No.: 34,305

[22] Filed: Apr. 3, 1987

[51] Int. Cl.[5] .................... H01L 27/12; H01L 29/06; H01L 29/78

[52] U.S. Cl. ...................... 357/49; 357/55; 357/23.4

[58] Field of Search ................... 357/55, 23.4

[56] References Cited

U.S. PATENT DOCUMENTS

| | | | |
|---|---|---|---|
| 4,466,012 | 8/1984 | Fukushima | 357/55 |
| 4,542,396 | 9/1985 | Schutten et al. | 357/23.4 |
| 4,543,706 | 10/1985 | Bencuya et al. | 357/22 |
| 4,670,764 | 1/1987 | Benjamin et al. | 357/55 |

Primary Examiner—Rolf Hille
Assistant Examiner—Wael Fahmy

[57] ABSTRACT

A method and apparatus for providing interconnections between levels on a semiconductor substrate of various types includes first forming a plurality of trenches in the substrate and then forming conductive layers at the bottom of the trenches. The trenches are then filled with an oxide to provide a planar surface on the substrate. Various levels of trenches are provided with crossovers being formed by a bridging layer of a conductive material that is formed over an oxide layer in the lower level trenches. Vertical contacts are formed by etching an opening from the surface to the bottom of the trenches through the oxide layer and filling the opening with a metal plug.

14 Claims, 5 Drawing Sheets

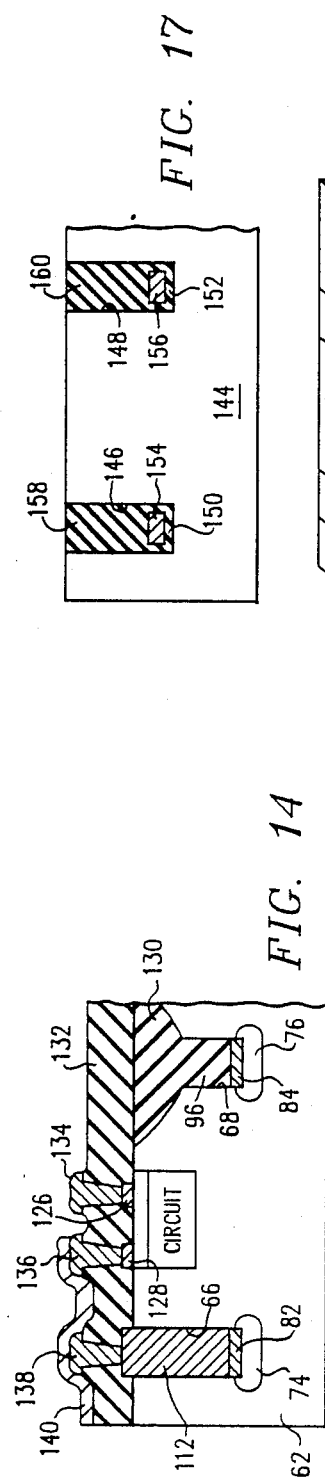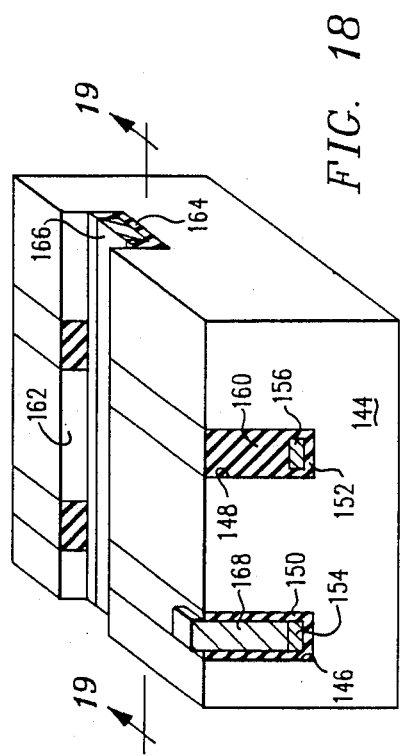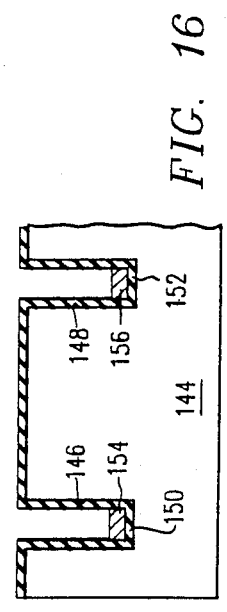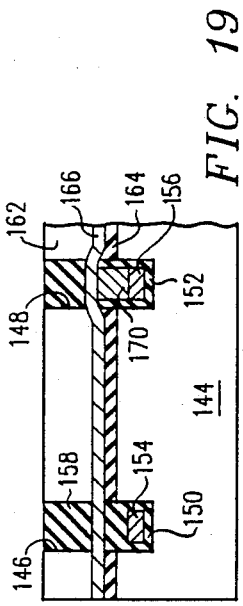

BURIED MULTILEVEL INTERCONNECT SYSTEM

TECHNICAL FIELD OF THE INVENTION

The present invention pertains in general to high density semiconductor circuits, and more particularly, to the on-chip interconnect systems that are buried beneath the surface of the semiconductor chip.

BACKGROUND OF THE INVENTION

As integrated circuits become more complex and packing density increases, difficulty of interconnecting the individual circuits, circuit elements and groups of circuits together on a substrate, also becomes more complex. At present, multiple layers of interconnecting metal strips separated by an insulator are utilized, which strips are connected to the underlying circuit elements through contacts. This is referred to as a multilevel interconnect system. Typically the multilevel interconnects are fabricated on a semiconductor substrate from polycrystalline silicon, aluminum or some type of refractory material. The substrate can be any type of semiconductor material such as silicon, gallium arsenide or any III-V compound or Mercury Cadmium Telluride or any II-VI compound.

In fabricating multilevel interconnects, it is necessary to sequentially form each layer of interconnect by either depositing or sputtering a layer of conductor onto the substrate followed by a patterning step and then overlying that layer with a layer of insulator followed by the next layer of conductors. This multilevel interconnect system presents some disadvantages as the integrated circuit becomes more dense, since the surface topology tends to become more irregular. This requires the interconnect levels to follow the topology of the surface. An additional disadvantage in the multilevel interconnect system is that each layer has its own adhesion problems that can result in the delamination of layers from one another. Another disadvantage to the multilevel interconnect system is that contacts must be brought up from the surface where the circuit elements are formed in order to make the interconnection.

Another technique to alleviate the problem of multilevel interconnects is to provide buried regions of conductive material which are sometimes referred to as "buried tank" of semiconductor material. These buried tanks are utilized for short conductive runs, since the resistivity of doped semiconductor material is relatively high compared to the conductor strips utilized in the multilevel interconnect techniques.

SUMMARY OF THE INVENTION

The present invention disclosed and claimed herein comprises a buried level interconnect for a semiconductor substrate and the method for formation thereof. The buried level interconnect comprises a layer of conductive material disposed in a trench formed in the surface of the substrate and having a bottom surface at a first level. Conductive plugs are provided that are connected to selective portions of the conductive layer at the bottom of the trench and extending to the surface of the substrate. The remaining portions of the trench are filled with an insulating oxide. The buried level interconnects are formed by first forming the trench and then depositing a conductive layer at the bottom of the trench. This is followed by depositing an oxide layer in the trench having the upper surface planar with respect to the surface of the substrate. Openings are then cut into the oxide within the trench to expose select portions of the conductive layers, into which conductive material is deposited to form vertical contacts. The substrate can be any type of semiconductor material such as silicon, gallium arsenide or any III-V compound or Mercury Cadmium Telluride or any II-VI compound.

In another embodiment of the present invention, a second level trench is formed to an intermediate and second level which has a bottom surface which intersects with the sidewalls of the first trench. The bottom surface of the intermediate or second level trench has a conductor layer formed over the surface thereof with a conductive bridge being formed over the gap in the bottom surface at the intersection of the two trenches. Vertical contacts are provided for interfacing the surface of the substrate with the conductive layer in the intermediate level trench.

The intermediate or second level buried interconnect is formed by first forming a trench shallower than the trench at the first or bottom level and then filling the first trench with an insulating oxide to a level proximate to the bottom surface of the intermediate level trench. A conductive layer is then deposited over the bottom surface of the intermediate level trench and the portion of the insulating oxide at the intersection of the two trenches. An insulating oxide layer is then deposited in both trenches to a level planar with the surface of the substrate. Openings are then made in the insulating oxide layer to expose select portions of both the conductive layer at the bottom of the intermediate level trench and at the bottom of the first and deeper trench, and then conductive material deposited in the openings to form the vertical contacts.

In an alternate embodiment of the present invention, each level of trenches is formed in a modular process by first forming a trench to a predetermined level and then forming a conductive layer in the bottom of the trench. This is followed by filling the trench with an oxide layer and forming a vertical contact from the conductive layer at the bottom of the trench to the surface. Subsequent trenches are formed by the same modular process at shallower levels. Buried level interconnects are formed between levels by selectively forming a vertical contact at a previous level and at a location that will be intersected by another intermediate level trench. When the intermediate level trench is first formed, it will etch both silicon and the vertical contact down to the level of the bottom surface thereof.

The present invention provides the technical advantage of having interconnecting conductor strips buried beneath the surface of the substrate, which conductive layers do not affect the topology of the substrate. An additional technical advantage is provided in that an isolating oxide layer is formed over the buried interconnect, which insulating oxide layer functions to isolate sections of the substrate. A further technical advantage is provided in that the buried level interconnects at different levels and can crossover each other and be separated by a relatively thick oxide layer which reduces overlap capacitance.

BRIEF DESCRIPTION OF THE DRAWINGS

For a more complete understanding of the present invention and the advantages thereof, reference is now made to the following description taken in conjunction with the accompanying Drawings in which:

FIG. 14 illustrates a cross-sectional view of a completed device illustrating two buried level interconnects and a circuit formed in the surface of the silicon substrate therebetween; and FIGS. 15-19 illustrate an alternate embodiment for forming the buried level interconnects.

DETAILED DESCRIPTION OF THE INVENTION

Figure 1:
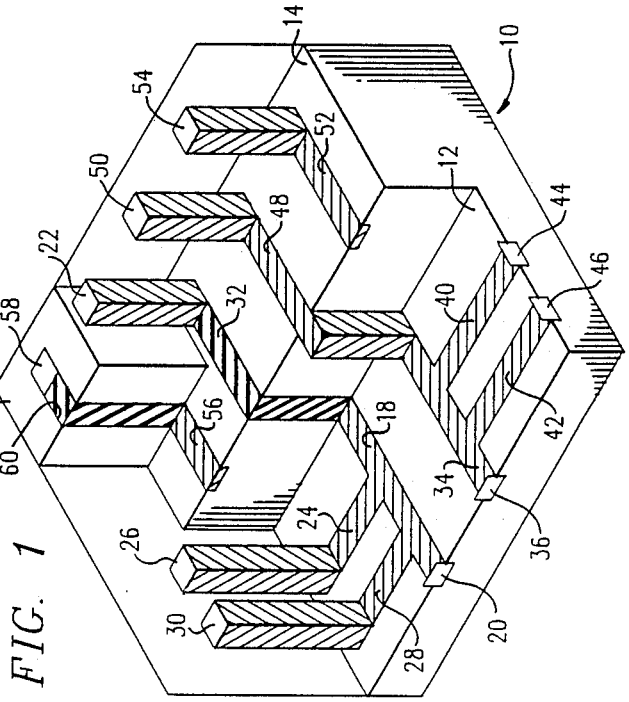
FIG. 1 illustrates a perspective cut-away view of a semiconductor chip using the buried level interconnect system of the present invention.

Referring now to FIG. 1, there is illustrated a cut-away perspective view of a substrate 10 utilizing the buried interconnect system. For illustrative purposes, two levels of buried interconnects are shown with one level being disposed on a first plane 12 and a second level being disposed on a second plane 14, with the substrate 10 having a surface 16. The substrate can any type of semiconductor material such as silicon, gallium arsenide or any III-V compound or Mercury Cadmium Telluride or any II-VI compound. In the preferred embodiment, the substrate material is silicon.

The first plane 12 has a conductor strip 18 running from one side of the plane to the other with the conductor strip 18 being interfaced to the side of the semiconductor chip 10 through a contact 20. The other end of the conductor strip 18 is interfaced with surface 16 through a vertical contact 22. The conductor strip 18 is also connected to the surface through a conductor strip 24 which is disposed in the plane 12 and which is connected to surface through a vertical contact 26. In a similar manner, the conductor strip 18 is connected to the surface through a conductor strip 28 in plane 12 and a vertical contact 30. The conductor strip 18 is formed in a trench 32 which is formed in the surface of the substrate 10 and then filled with oxide.

A second conductor strip 34 is disposed in plane 12 parallel to the conductor strip 18, and interfaced with the side of substrate 10 through a side contact 36 and to the second plane 14 with a vertical contact 38. It is important to note that the vertical contact 38 only extends between the first plane 12 and second plane 14 and does not extend to the surface plane 16.

The second plane 14 also contains two conductor strips 40 and 42 interconnected to the conductor strip 34 at right angles thereto and extending from the conductor strip 34 to the side of the semiconductor chip 10. Side contacts 44 and 46, respectively, are provided for interface with the side of semiconductor chip 10.

The vertical contact 38 which interconnects the strip 34 in plane 12 with second plane 14, is connected to a conductor strip 48 in the second plane 14. The conductor strip 48 is connected to the surface plane 16 through a vertical contact 50. The second plane 14 also contains a conductor strip 52 which is connected to the surface plane 16 through vertical contact 54. A conductor strip 56 is also illustrated in the second plane 14, which is connected to the surface plane through a vertical contact 58. The conductor strip 56 is disposed in a trench 60 which is filled with oxide. It should be noted that the trench 60 only extends from the surface plane 16 to the second plane 14 whereas the trench 32 that contains the conductor strip 18 extends from the surface plane 16 to the first plane 12. As will be described hereinbelow, the conductor strips 52 and 56, in addition to the conductor strip 48, can extend outward in the second plane 14 and crossover any of the conductor strips in the first plane 12.

Figure 2:
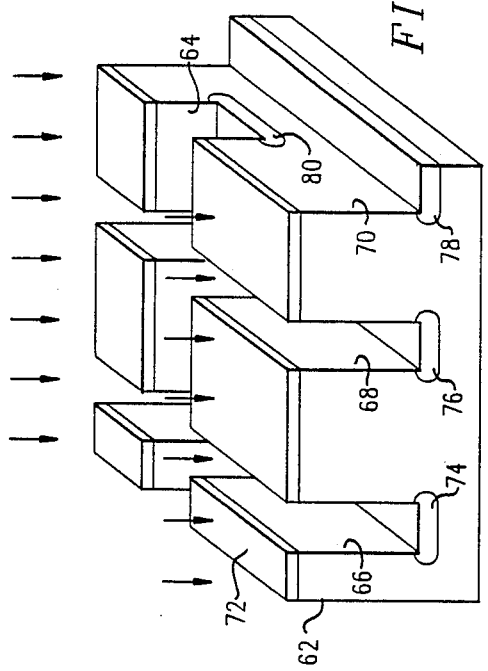
FIG. 2 illustrates one step in the process for forming the first and second levels of buried level interconnects after formation of the trenches and implanting of impurities therein.

Referring now to FIG. 2, there is illustrated a perspective view of one step in the process for forming the buried interconnects of the present invention. For illustrative purposes, three buried conductors will be illustrated in the first plane and a single buried will be illustrated in a second and intermediate plane. A semiconductor chip 62 is provided which is any type of semiconductor material such as silicon, gallium arsenide or any type of semiconductor. In the preferred embodiment, silicon is utilized. However, it should be understood that any semiconductor substrate or similar medium can be utilized to form the buried interconnects.

The substrate 62 is first patterned to define a shallow trench 64. The substrate 62 is then etched with a vertical silicon etch to form shallow trench 64 with the walls of the shallow trench 64 being slightly tapered. Thereafter, the trench 64 is filled with an oxide to the surface and then patterned for the deeper trenches. The patterning step is basically the formation of some type of mask such as photoresist or nitride on top of substrate.

After patterning the substrate for the deep trenches, the oxide that was disposed in the shallow trench 64 is etched with an anisotropic etch which will vertically remove the oxide in the trench only within the deep trench pattern. A silicon selective etch is utilized to etch the deep trenches and define trenches 66, 68 and 70, which trenches are deeper than trench 64. Since the oxide that filled trench 64 was removed where it crosses or intersects the trenches 66-70, this portion will be deeper than trench 64. For illustrative purposes, trench 70 is only shown with one sidewall.

After formation of trenches 64-70, the oxide is removed from trench 64 and a layer of oxide 72 is deposited or grown only on the surface of the substrate 62 and not on the bottom surfaces of trenches 64-70, impurities are then implanted into the bottom surfaces of trenches 64-70 with the oxide layer 72 preventing implantation into the upper surface.

After ion implantation, the substrate 62 is subjected to an annealing step to drive the impurities to a predetermined depth to define a region of high conductivity at the bottom of the trenches 64-70. This results in a conductive layer 74 being formed in the bottom of trench 66, a layer 76 formed in the bottom of trench 68, a layer 78 formed in the bottom of trench 70 and a layer 80 formed in the bottom of trench 64.

Figure 3:
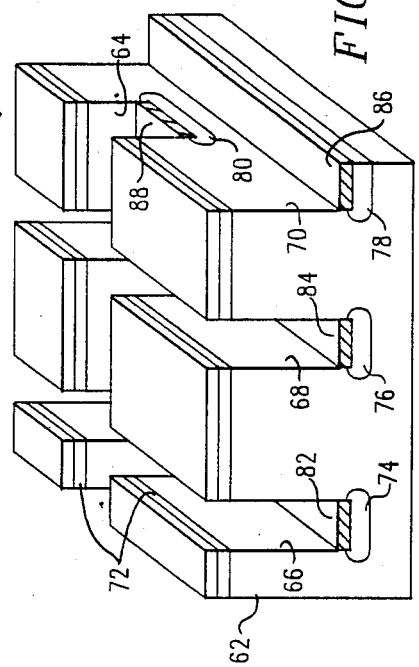
FIG. 3 illustrates the step of siliciding the bottom of the first and second level trenches.

Referring now to FIG. 3, there is illustrated a second step in the process whereby a layer of titanium disilicide is formed on the bottom of trenches 66-70 overlying layers 74-78, and if necessary, on the bottom of trench 64 overlying layer 80. The titanium disilicide lowers the resistivity of the buried conductors. To form titanium disilicide, first a thin layer of oxide is formed on the sidewalls of the trenches 64-70. This sidewall oxide layer is formed by first depositing or growing a conformal layer of oxide over the surface of the substrate 62 in the trenches 64-70. The substrate is then subjected to an anisotropic etch in the vertical direction to clear the oxide from flat surfaces This etch leaves a sidewall oxide on the side of all vertical surfaces. The purpose of sidewall oxide is to seal the vertical surfaces of trenches 64-70, as will be more clearly described hereinbelow. The process for forming sidewall oxides is described in U.S. Pat. No. 4,356,040 issued to Hornq-Sen Fu et al on Oct. 26, 1982, and assigned to Texas Instruments, Inc.

After formation of the sidewall oxide on the vertical surfaces of the trenches 64-70, a layer of titanium, which is a refractory metal, is sputtered onto the top of substrate 62 in a vacuum apparatus to a thickness of approximately 1000 angstroms. This is a conformal layer that will overlie the exposed silicon surfaces in the trenches 64-70. Typically, sputtering of the titanium layer is preceded by a wet etch in 1.0% hydrochloric acid to insure that no residual oxide remains on any of the exposed silicon surfaces.

After formation of the titanium layer, the titanium is reacted at a temperature of approximately 675° C. in an atmosphere of argon and nitrogen for approximately thirty minutes. This reaction allows the portion of the titanium layer that overlies the bottoms of trenches 64-70 to consume silicon and form titanium disilicide with the sidewall oxide preventing formation of titanium disilicide on the vertical surfaces. This reaction results in a thickness of titanium disilicide of approximately 1500 angstroms with a small portion of the titanium remaining unreacted on the surface. A resultant silicide layer 82 is formed in the bottom of trench 66, a silicide layer 84 formed in the bottom of trench 68, a silicide layer 86 formed in the bottom of trench 70, and a silicide layer 88 formed in the bottom of trench 64.

The original titanium layer is converted to titanium disilicide only in the silicide layers 82-88 with only portions of the titanium layer remaining, which portions overlie oxide. Since the titanium was reacted in an argon and nitrogen atmosphere a portion of the exposed surface of the titanium in these regions will be converted to titanium nitride, with the portion of the unsilicided titanium adjacent the underlying oxide being converted to titanium oxide. The resulting structure is illustrated in FIG. 3.

Figure 4:
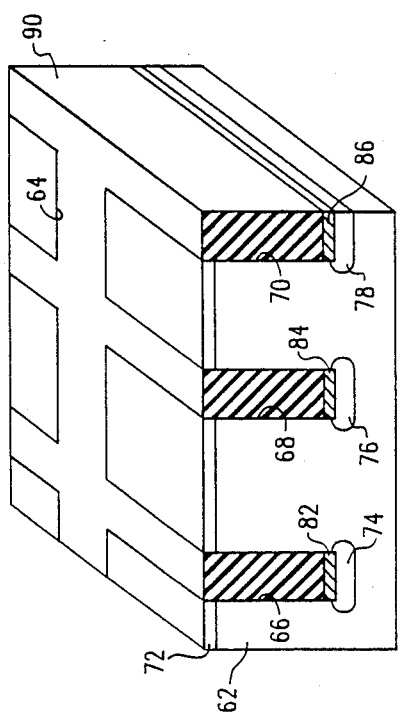
FIG. 4 illustrates the step of filling the first and second level trenches with oxide.

After the titanium disilicide layers 80-88 are formed, the trenches 64-70 are filled with an oxide layer 90 by depositing oxide on the surface and then planarizing the upper surface of the substrate. The resulting structure is illustrated in FIG. 4. After planarization, an oxide selective etch is utilized which etches the oxide layer 90 in all trenches 64-70 down to the level of trench 64 at the bottom surface thereof to form an oxide layer 91 in trenches 66-70. A layer of polycrystalline silicon ("poly") is deposited in the trenches 64-70 and then the substrate patterned and the poly etched such that only a poly layer 92 remains within the trench 64. In the preferred embodiment there is some capacitance between the silicide layers 74-78 in the bottom of trenches 66-70 and the poly in trench 64. This capacitance is a function of the area of the overlap, the dielectric and the thickness of the dielectric.

Figure 5A:
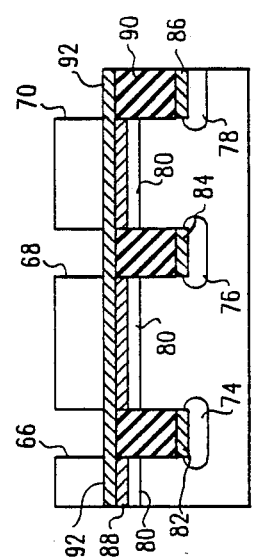
FIG. 5a illustrates a cross-section diagram of the structure of FIG. 5 taken along lines 5—5.
Figure 5:
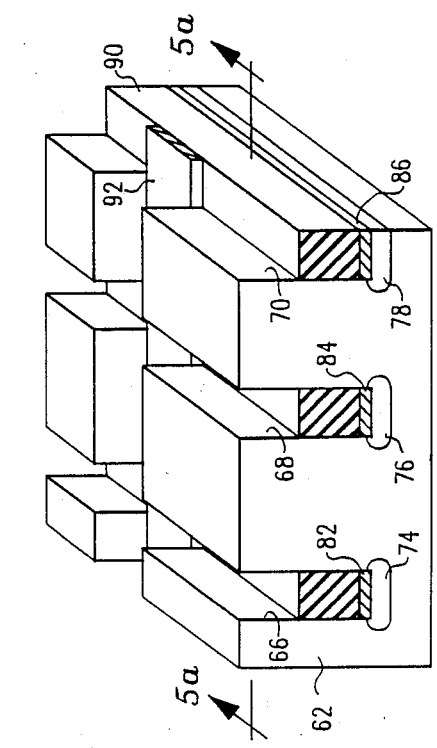
FIG. 5 illustrates the step of depositing a layer of poly on the second level of interconnect.

Referring now to FIG. 5a, there is illustrated a cross-sectional diagram taken along line 5—5 in FIG. 5. It can be seen from this diagram that the poly layer 92 bridges the portion of the oxide layer 90 that is disposed at the intersection of the bottom surface of trench 64 with the trenches 66 68 and 70. The oxide layer 91 acts as an insulation layer between and also as a surface upon which to deposit polycrystalline silicon. The poly layer 92 is approximately 4500 angstroms in thickness.

Figure 6:
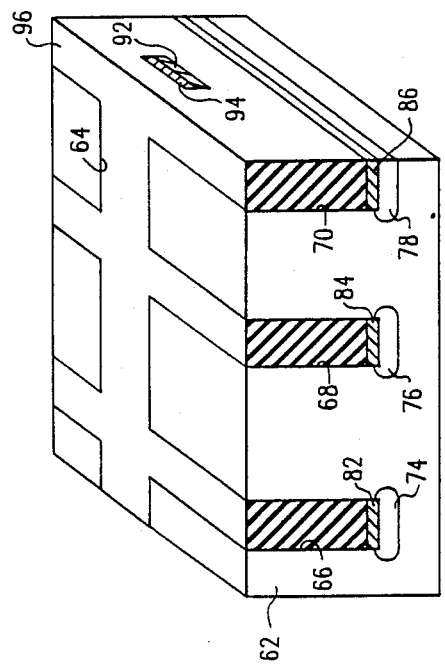
FIG. 6 illustrates the step of forming a silicide in the second level trench and filling the trenches with oxide.

After forming the poly layer 92, the substrate 62 is then patterned to form titanium disilicide on the surface of poly layer 92. This utilizes the process described hereinabove. This results in a titanium layer 94 being formed over the poly layer 92. This bridging portion of the poly layer 92 and the conductive silicide layers 66-70. Oxide is then deposited in all trenches 64-70 to completely fill these trenches to form an oxide layer 96 in trenches 64-70. This oxide layer is formed after a planarizing step to provide a relatively planar surface on the substrate 62. The resulting structure is illustrated in FIG. 6.

Figure 7:
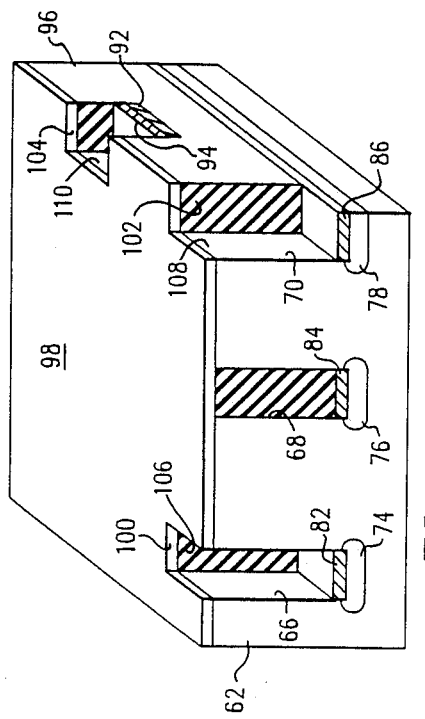
FIG. 7 illustrates the initial step of forming the openings from the surface to the two conductor levels in which contacts are to be formed.
Figure 8:
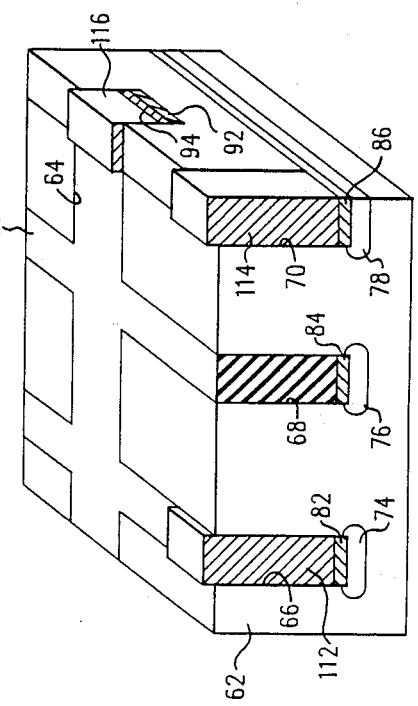
FIG. 8 illustrates the step of forming the contact.

After forming the oxide layer 96 with the two buried level interconnects underneath thereby filling all trenches 64-70, the surface is then masked to form the vertical contacts. This utilizes a layer of photoresist 98 disposed over the substrate 62 as illustrated in FIGURE 7. For illustration purposes, a contact opening 100 is formed in the photoresist layer 98 directly over the oxide layer 90 and a select portion of the trench 66. In a similar manner, a contact opening 102 is defined in photoresist layer 98 over the trench 70 and a contact opening 104 is defined in the photoresist layer 98 over the trench 64. Each of these openings 100-104 overlies one of the titanium layers 82, 86 and 94, respectively, located at the bottom of the respective trenches. A suitable plasma etch is then utilized such as a chlorine based etch which will selectively etch in a vertical direction the oxide laYer 96 to produce a vertical contact opening 106 in the trench 66, a vertical contact opening 108 in the trench 70 and a vertical contact opening 110 in the trench 64.

After forming the vertical contact openings 106-110, a metal such as aluminum or tungsten silicide is deposited to fill up the vertical openings 106-110 to form vertical contacts 112, 114 and 116, respectively. The surface is then patterned to remove any metal that overlies the remainder of the substrate 62 to leave only the upper surface of the vertical contacts 112-116 exposed for contact with later formed circuitry and circuit elements on the substrate 62.

Figure 9:
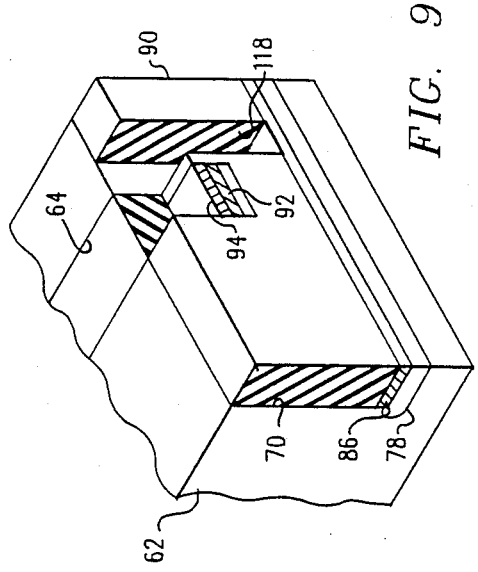
FIGS. 9-11 illustrate the steps of forming a buried interconnect between two of the buried layers.
Figure 10:
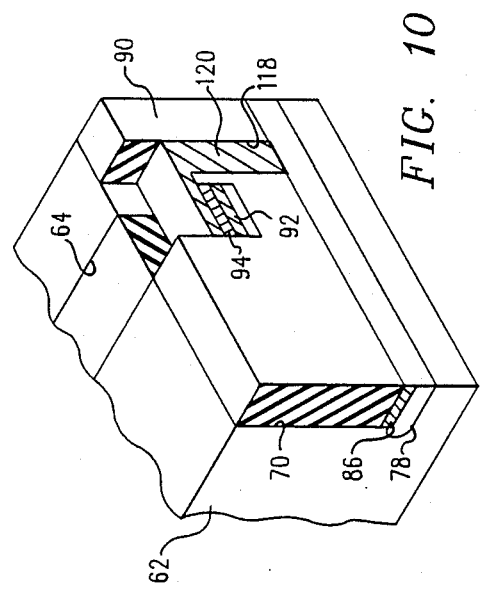
Figure 11:
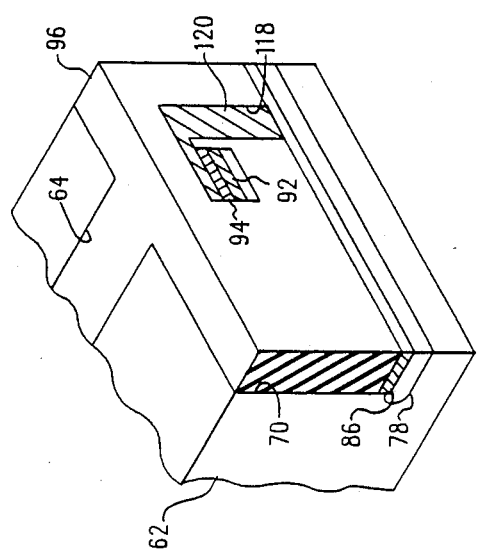

Referring now to FIGS. 9-11, there is illustrated a method for forming a contact between the silicide layer 86 and the titanium layer 94. After formation of the poly layer 92 and the titanium layer 94 and subsequent formation of oxide layer 96, as illustrated in FIG. 6, an opening 118 is formed in the oxide layer 96 in trench 70 and trench 64 proximate to the intersection thereof. The opening 118 exposes a portion of the silicide layer 86 at the bottom of trench 70 and also the silicide layer 94 at the bottom of trench 64.

After formation of the opening 118, metal is deposited to a predetermined thickness extending from a point above the upper surface of the silicide layer 86 to the upper surface of the silicide layer 94. This will result in the formation of a vertical contact 120 which does not extend to the surface of the substrate 62. Thereafter, the layer of oxide 96 is formed up to the surface of the substrate 62 with the vertical contact 120 providing a buried contact between two buried layers.

Figure 12:
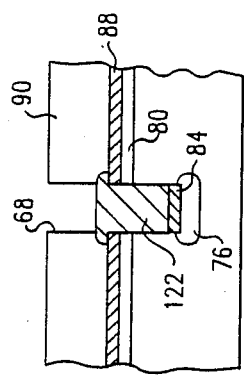
FIG. 12 illustrates an alternate method of forming a contact between two buried layers.
Figure 13:
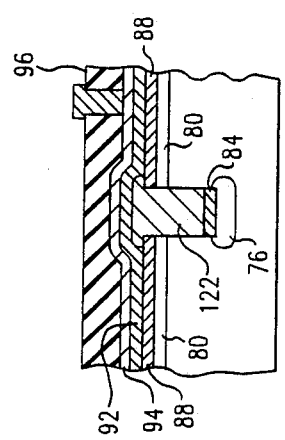
FIG. 13 illustrates a cross-sectional view of the buried level interconnects interfaced with circuit elements on the chip.

Referring now to FIG. 12, there is illustrated an alternate embodiment for forming the vertical contact between two buried layers. FIG. 12 illustrates a cross-sectional diagram of trench 64 taken along the center line thereof and of the trench 68. Prior to forming the poly layer 92 illustrated in FIGS. 5 and 5a, the layer 90 illustrated in FIG. 4 is patterned and etched in a similar manner to that illustrated with respect to FIG. 7. This patterning step removes a portion of the oxide layer 90 that fills the trenches 64 and 68 proximate to the intersection thereof and exposes the silicide layer 84 at the bottom of trench 68. Thereafter, metal is deposited over the substrate to a predetermined thickness to a point that is approximately 4000 angstroms above the upper surface of the silicide layer 84 in trench 68 and the silicide layer 88 in trench 64. This results in a vertical contact 122 being formed connecting silicide layers 84 and 88. Thereafter, the poly layer 92 can be formed followed by the formation of the silicide layer 94, as illustrated in FIG. 13. The embodiment of FIG. 12 requires the vertical contact between two buried layers to be formed prior to formation of the metallization layer on the bottom of an intermediate level trench whereas the embodiment of FIGS. 9–11 allows the buried vertical contact to be formed at a later time in the process.

Referring now to FIG. 14 there is illustrated a cross-section of substrate 62 of a completed device with only buried silicide layers 82 and 84 in trenches 66 and 68, respectively, shown with a completed circuit element 124 formed in the surface of substrate 62. Circuit element 124 can be any type of semiconductor circuit element such as a transistor, logic gate, etc., or any type of circuit network such as a programmable logic array (PLA). The circuit element 125 has two contact pads 126 and 128 formed on the surface thereof. Typically, semiconductor junctions in a given circuit element are from two to four microns in thickness whereas the trenches can be four microns or greater.

During conventional processing, circuit elements on the substrate 62 are separated by a thick field oxide for isolation purposes. This field oxide can be merged with the oxide layer 96 filling trenches 64–70. In FIG. 13, a field oxide region 130 is illustrated as being merged with oxide layer 96 in trench 68. An interlevel 132 of oxide formed with contacts 134 and 136 formed to contact pads 126 and 128, respectively, and a contact 138 formed to contact the vertical contact 112. An interconnecting layer 140 of metal is provided to connect contacts 136 and 138, thus providing an electrical connection between circuit element 124 and buried silicide layer 82. The oxide in the trenches provides isolation between various regions on the substrate.

Referring now to FIG. 15, there is illustrated an alternate embodiment for forming the buried level interconnects. FIG. 15 illustrates a substrate 144 in which two trenches 146 and 148 are formed. A thin layer of oxide is grown or deposited over the substrate forming a conformal layer over the substrate 144 and in the trenches 146 and 148. The trenches 146 and 148 ar formed by a trench etch utilizing any single crystal silicon etch with the thin layer of oxide deposited or grown on the substrate 144 resulting in a layer of oxide 150 at the bottom of trench 146 and a thin layer of oxide 152 at the bottom of trench 148 with the oxide layers 150 and 152 conformally covering both the bottom and the sides of trenches 146 and 148, respectively.

After formation of the thin layer of oxide, metal is deposited or sputtered onto the substrate 144 and into the trenches 146 and 148. One such metal is tungsten silicide. Since the metal is deposited or sputtered, some metal will be present on the upper surface. This can be etched back to remove the tungsten silicide on the surface and a partial amount thereof in the trench leaving behind a conductive layer 154 in the bottom of trench 146 and a conductive layer 156 in the bottom of trench 148. It is important to note that the conductive layers 154 and 156 are separated from the silicon surfaces of the trench 146 and 148, respectively, by the oxide layers 150 and 152 This decreases the capacitance between the conductive layers 154 and 152 and the substrate 144. However, in some applications, it may not be necessary to have the oxide layers 150 and 152 in that contact of the conductive layers 154 and 156 with the silicon surfaces of trenches 146 and 148, respectively, would provide sufficient operational characteristics. The resultant structure is illustrated in FIG. 16.

After formation of the conductive layers 154 and 156, trenches 146 and 148 are filled with an oxide and the surface planarized as described above, resulting in an oxide layer 158 being formed in trench 146 over conductive layer 154, and an oxide layer 160 formed in trench 148 overlying conductor layer 152. The resulting structure is illustrated in FIG. 17.

After formation of the oxide layers 158 and 160, the surface is patterned to open a selective location over one of the trenches 158 and 160 and then the oxide etched away until the surface of the underlying conductive layer 154 and 156 is exposed. Metal is then deposited or sputtered forming a plug or vertical contact extending upward to the surface and covering the surface. The surface is then planarized and etched to leave only the vertical contacts that was formed in the opening. This results in a vertical contact 168 being formed in trench 146, as illustrated in FIG. 18.

After formation of the oxide layers 158 and 160 in the trenches 146 and 148, the surface of the substrate is patterned and a trench 162 etched in the surface at an angle with respect to the conductive layers 154 and 156. The trench 162 is etched to a depth less than that of the trenches 146 and 148. During etch, some silicon and some of the oxide layers 158 and 160 are etched away such that the bottom surface of trench 162 has gaps formed by the unetched portions of oxide layers 158 and 160. Due to the rate of etch, the oxide layers 158 and 160 will be removed at about the same rate as the silicon. The etch of the preferred embodiment is a conventional etch that will etch silicon, silicon dioxide and metal at approximately the same rate. After formation of trench 162 with the second trench etch, the sidewalls are coated with an oxide to form a bottom oxide layer 164 and then a layer of metal 166 deposited or sputtered onto the bottom surface of trench 162 and spaced away from the bottom thereof by the oxide layer 164. The resulting structure is illustrated in FIG. 18.

With reference to FIG. 19, the process for forming a buried vertical contact between levels is illustrated. The opening for the buried vertical contact is formed and the metal deposited therein prior to forming the trench 162. For example, in FIG. 19, a vertical contact is formed in trench 148 and then trench 162 formed such that it intersects 148 at the point where the vertical contact was formed. During the trench etch, both the oxide in trench 146, the contact in trench 148 and the silicon is etched at essentially the same rate. This results in the contact formed in trench 148 being etched downward to the level of the bottom surface of trench 162. This results in a buried level vertical contact 170 being formed in the bottom of trench 148 at the intersection of trench 162 and trench 148. Thereafter, the thin layer of oxide 164 and the conductive layer 166 are formed, bridging over the trench 148 at the intersection with trench 162 and contacting the vertical buried level contact 170. This results in a buried level interconnect between the conductive layer 166 and the conductive layer 156.

With this alternate embodiment, each trench is formed by the same number of steps. These steps are (1) form the trench, (2) form the conductive layer in the bottom of the trench, (3) fill the trench with an insulating layer of oxide, and (4) form the opening and vertical contact to the surface. By repeating these modular process steps for each level of trenches, a plurality of trench levels can be formed. Since the vertical contacts are formed prior to forming a subsequent level of trenches, the vertical contacts can be etched back to form the buried level interconnect between levels. Although not shown, if three levels are to be formed, the first level can be connected to the third level by forming a vertical contact during processing of the first level in a select location over which the trench at the third level is to be formed. Since the second level trench is formed by selectively patterning only the trench area to the second level, this vertical contact will be unaffected during the processing of the second level trench and can be utilized as a buried level interconnect between the third and first level trenches.

In summary, there has been provided a method for forming buried level interconnects in a semiconductor substrate. Trenches are initially formed in the substrate and then conductive layers such as titanium disilicide formed on the bottom of the trenches. The trenches are filled with an insulating oxide on the surface and then contacts are formed down through the oxide in selective regions. An intermediate level of connection can be provided by etching a shallower trench at an angle with respect to the first and deeper level of trenches. A cross over is provided by first filling the trenches with oxide after formation of a conductive layer on the bottom of the trenches and then etching the oxide layer back to the level of the shallow trench. A layer of amorphous semiconductor material is then deposited in the shallow trench to form a bridge over the intersection between the shallow and deep trenches and then the trench is filled with oxide. Contacts are then formed to both the shallow and the deep trenches.

Although the preferred embodiment has been described in detail it should be understood that various changes, substitutions and alterations can be made therein without departing from the spirit and scope of the invention as defined by the appended claims.

What is claimed is:

1. A substrate with buried level interconnects comprising:
   a trench disposed at the surface of the substrate, and having a bottom surface and two side surfaces;
   a first conductive layer disposed on the bottom surface of said trench;
   conductive plugs formed at selected locations in said trench and extending from the conductive layer to the surface of the substrate to provide electrical contact therebetween; and
   an insulating material disposed within said trench over said conductive layer and between said conductive plugs.

2. The substrate of claim 1 wherein said first conductive layer comprises a layer of refractory material.

3. The substrate of claim 1 wherein said insulating layer is comprised of an oxide layer and said substrate is comprised of silicon.

4. The substrate of claim 1 wherein said first conductive layer is comprised of doped semiconductor material.

5. The substrate of claim 1 further comprising:
   an intermediate level trench formed in the surface of the substrate at an angle to said trench, said intermediate level trench having a bottom surface and sidewalls, the bottom surface being at a level intermediate to the surface of the substrate and the bottom surface of said trench, the bottom surface of the intermediate level trench intersecting a side surface of said trench at a location,
   a second conductive layer disposed on the bottom surface of said intermediate level trench and extending across said first conductive layer at said location;
   second layer conductive plugs formed at selective locations in said intermediate level trench and extending from the conductive layer disposed on the bottom surface of said intermediate level trench to the surface of the substrate to provide electrical contact with said conductive layer disposed on the bottom surface of said intermediate level trench; and
   an insulating material disposed within said intermediate level trench over said conductive layer disposed on the bottom surface of said intermediate level trench and between said second layer conductive plugs.

6. The substrate of claim 2, further comprising:
   an intermediate level trench formed in the surface of the substrate at an angle to said trench, said intermediate level trench having a bottom surface and sidewalls, the bottom surface being at a level intermediate to the surface of the substrate and the bottom surface of said trench, the bottom surface of the intermediate level trench intersecting a side surface of said trench,
   a second conductive layer disposed on the bottom surface of said intermediate level trench;
   second layer conductive plugs formed at selective locations in said intermediate level trench and extending from the conductive layer disposed on the bottom surface of said intermediate level trench to the surface of the substrate to provide electrical contact with said conductive layer disposed on the bottom surface of said intermediate level trench;
   an insulating material disposed within said intermediate level trench over said conductive layer disposed on the bottom surface of said intermediate level trench and between said second layer conductive plugs; and means disposed within said trench to electrically connect said first conductive layer at the bottom of said trench and said second conductive layer disposed on the bottom surface of said intermediate level trench.

7. The substrate of claim 6 wherein said means for connecting comprises a conductive plug extending from the conductive layer on the bottom of said trench upward to the level of the bottom surface of said intermediate level trench at the intersection of said trenches and connected to said conductive layer disposed on the bottom surface of said intermediate level trench.

8. The substrate of claim 5 wherein the substrate comprises a semiconductor compound selected from the following groups III-V and II-VI.

9. A substrate with buried interconnects, comprising:
a first conductive layer having a length and a width, said length being greater than said width, and disposed beneath a surface of said substrate;
a first conductive plug extending from said first conductive layer to said surface of said substrate at a first location along said length;
a second conductive plug extending from said first conductive layer to said surface of said substrate at a second location along said length; and
insulating material disposed over said first conductive layer along its length and between said first and second locations.

10. The substrate of claim 9, wherein said first conductive layer is comprised of a first portion and a second portion, wherein said first portion and said second portion are positioned at an angle to each other.

11. The substrate of claim 9, and further comprising:
an intermediate conductive layer having a length and a width, said length being greater than said width, and disposed beneath a surface of said substrate at a level intermediate to the surface of the substrate and the first conductive layer, at an angle to the first conductive layer, and extending across said first conductive layer;
a third conductive plug extending from said intermediate conductive layer to said surface of said substrate at a first location along length of said intermediate conductive layer;
a second conductive plug extending from said intermediate conductive layer to said surface of said substrate to a second location along the length of said intermediate conductive layer; and
insulating material disposed over the said intermediate conductive layer along its length and between said first and second locations along said length of said intermediate conductive layer.

12. The substrate of claim 11, wherein said intermediate conductive layer is comprised of a third portion and a fourth portion, wherein said third portion and said fourth portion are positioned at an angle to each other.

13. The substrate of claim 11, and further comprising:
an intermediate conductive layer having a length and a width, said length being greater than said width, and disposed beneath a surface of said substrate at a level intermediate to the surface of the substrate and the first conductive layer, and at an angle to the first conductive layer;
a third conductive plug extending from said intermediate conductive layer to said surface of said substrate at a first location along length of said intermediate conductive layer;
a second conductive plug extending from said intermediate conductive layer to said surface of said substrate to a second location along the length of said intermediate conductive layer;
insulating material disposed over the said intermediate conductive layer along its length and between said first and second locations along said length of said intermediate conductive layer; and
a means of connecting the first conductive layer with the intermediate conductive layer.

14. The substrate of claim 13 wherein said means for connecting comprises a conductive plug disposed at the first conductive layer extending upward and connecting to the intermediate conductive layer.

* * * * *